(12) United States Patent
Beffa (10) Patent No.: US 7,117,063 B2
(45) Date of Patent: Oct. 3, 2006

(54) SORTING A GROUP OF INTEGRATED CIRCUIT DEVICES FOR THOSE DEVICES REQUIRING SPECIAL TESTING

(75) Inventor: Raymond J. Beffa, Boise, ID (US)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 11/240,178

(22) Filed: Sep. 29, 2005

(65) Prior Publication Data

US 2006/0030963 A1 Feb. 9, 2006

Related U.S. Application Data

(63) Continuation of application No. 10/791,193, filed on Mar. 2, 2004, which is a continuation of application No. 10/379,257, filed on Mar. 3, 2003, now Pat. No. 6,788,993, which is a continuation of application No. 09/607,201, filed on Jun. 28, 2000, now Pat. No. 6,529,793, which is a continuation of application No. 09/145,758, filed on Sep. 2, 1998, now Pat. No. 6,122,563, which is a continuation of application No. 08/801,565, filed on Feb. 17, 1997, now Pat. No. 5,844,803.

(51) Int. Cl.
*G06F 19/00* (2006.01)

(52) U.S. Cl. ............... 700/121; 700/95; 700/108; 700/109; 700/213; 250/306; 250/492.1; 250/234

(58) Field of Classification Search ............ 700/95–97, 700/108–112, 117, 121, 213, 215; 257/777, 257/712; 341/134, 154; 323/281, 313, 907; 250/306, 492.1, 234, 391.1, 492.2–492.3, 250/307, 233

See application file for complete search history.

(56) References Cited

U.S. PATENT DOCUMENTS

| 4,027,246 A | 5/1977 | Caccoma et al. |
| 4,032,949 A | 6/1977 | Bierig |
| 4,150,331 A | 4/1979 | Lacher |
| 4,454,413 A | 6/1984 | Morton, Jr. |
| 4,455,495 A | 6/1984 | Masuhara et al. |

(Continued)

FOREIGN PATENT DOCUMENTS

EP 0 849 675 A2 6/1998

(Continued)

OTHER PUBLICATIONS

Fresonke, Dean, *In-Fab Identification of Silicon Wafers with Clean, Laser Marked Barcodes*, Advanced Semiconductor Manufacturing Conference and Workshop, 1994, IEEE/SEMI, pp. 157-160.

*Primary Examiner*—Ramesh Patel
(74) *Attorney, Agent, or Firm*—TraskBritt (57) ABSTRACT

A method for sorting integrated circuit (IC) devices of the type having a fuse identification (ID) into those devices requiring enhanced reliability testing and those requiring standard testing includes storing fabrication deviation data, probe data, and test data in association with the fuse ID of each of the devices indicating each of the devices requires either enhanced reliability testing or standard testing. The fuse ID of each of the devices is then automatically read before, during, or after standard testing of the devices. The testing process requirement data stored in association with the fuse ID of each of the devices is then accessed, and the devices are sorted in accordance with the accessed data into those devices requiring enhanced reliability testing and those requiring standard testing.

18 Claims, 2 Drawing Sheets

U.S. PATENT DOCUMENTS

| | | |
|---|---|---|
| 4,510,673 A | 4/1985 | Shils et al. |
| 4,534,014 A | 8/1985 | Ames |
| 4,667,403 A | 5/1987 | Edinger et al. |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 4,985,988 A | 1/1991 | Littlebury |
| 5,003,251 A | 3/1991 | Fuoco |
| 5,043,657 A | 8/1991 | Amazeen et al. |
| 5,103,166 A | 4/1992 | Jeon et al. |
| 5,105,362 A | 4/1992 | Kotani |
| 5,110,754 A | 5/1992 | Lowrey et al. |
| 5,118,369 A | 6/1992 | Shamir |
| 5,175,774 A | 12/1992 | Truax et al. |
| 5,197,650 A | 3/1993 | Monzen et al. |
| 5,217,834 A | 6/1993 | Higaki |
| 5,219,765 A | 6/1993 | Yoshida et al. |
| 5,226,118 A | 7/1993 | Baker et al. |
| 5,235,550 A | 8/1993 | Zagar |
| 5,253,208 A | 10/1993 | Kang |
| 5,256,562 A | 10/1993 | Vu et al. |
| 5,256,578 A | 10/1993 | Corley et al. |
| 5,271,796 A | 12/1993 | Miyashita et al. |
| 5,289,113 A | 2/1994 | Meaney et al. |
| 5,294,812 A | 3/1994 | Hashimoto et al. |
| 5,296,402 A | 3/1994 | Ryou |
| 5,301,143 A | 4/1994 | Ohri et al. |
| 5,326,709 A | 7/1994 | Moon et al. |
| 5,345,110 A | 9/1994 | Renfro et al. |
| 5,347,463 A | 9/1994 | Nakamura et al. |
| 5,350,715 A | 9/1994 | Lee |
| 5,352,945 A | 10/1994 | Casper et al. |
| 5,355,320 A | 10/1994 | Erjavic et al. |
| 5,360,747 A | 11/1994 | Larson et al. |
| 5,399,531 A | 3/1995 | Wu |
| 5,420,796 A | 5/1995 | Weling et al. |
| 5,424,652 A | 6/1995 | Hembree et al. |
| 5,428,311 A | 6/1995 | McClure |
| 5,440,240 A | 8/1995 | Wood et al. |
| 5,440,493 A | 8/1995 | Doida |
| 5,442,561 A | 8/1995 | Yoshizawa et al. |
| 5,448,488 A | 9/1995 | Oshima |
| 5,450,326 A | 9/1995 | Black |
| 5,467,304 A | 11/1995 | Uchida et al. |
| 5,477,493 A | 12/1995 | Danbayashi |
| 5,483,175 A | 1/1996 | Ahmad et al. |
| 5,495,417 A | 2/1996 | Fuduka et al. |
| 5,504,369 A | 4/1996 | Dasse et al. |
| 5,511,005 A | 4/1996 | Abbe et al. |
| 5,516,028 A | 5/1996 | Rasp et al. |
| 5,537,325 A | 7/1996 | Iwakiri et al. |
| 5,538,141 A | 7/1996 | Gross, Jr. et al. |
| 5,539,235 A | 7/1996 | Allee |
| 5,563,832 A | 10/1996 | Kagami |
| 5,568,408 A | 10/1996 | Maeda |
| 5,570,293 A | 10/1996 | Tanaka et al. |
| 5,581,510 A | 12/1996 | Furusho et al. |
| 5,590,069 A | 12/1996 | Levin |
| 5,600,171 A | 2/1997 | Makihara et al. |
| 5,603,412 A | 2/1997 | Gross, Jr. et al. |
| 5,606,193 A | 2/1997 | Ueda et al. |
| 5,617,366 A | 4/1997 | Yoo |
| 5,619,469 A | 4/1997 | Joo |
| 5,625,816 A | 4/1997 | Burdick et al. |
| 5,642,307 A | 6/1997 | Jernigan |
| 5,654,204 A | 8/1997 | Anderson |
| 5,726,074 A | 3/1998 | Yabe |
| 5,764,650 A | 6/1998 | Debenham |
| 5,787,012 A | 7/1998 | Levitt |
| 5,787,190 A | 7/1998 | Peng et al. |
| 5,801,067 A | 9/1998 | Shaw et al. |
| 5,801,965 A | 9/1998 | Takagi et al. |
| 5,805,472 A | 9/1998 | Fukasawa |
| 5,828,778 A | 10/1998 | Hagi et al. |
| 5,837,558 A | 11/1998 | Zuniga et al. |
| 5,844,803 A * | 12/1998 | Beffa .......... 700/121 |
| 5,856,923 A | 1/1999 | Jones et al. |
| 5,865,319 A | 2/1999 | Okuda et al. |
| 5,867,505 A | 2/1999 | Beffa |
| 5,889,674 A | 3/1999 | Burdick et al. |
| 5,890,807 A | 4/1999 | Ingel et al. |
| 5,895,962 A | 4/1999 | Zheng et al. |
| 5,907,492 A | 5/1999 | Akram et al. |
| 5,915,231 A | 6/1999 | Beffa |
| 5,927,512 A | 7/1999 | Beffa |
| 5,963,881 A | 10/1999 | Kahn et al. |
| 5,976,899 A | 11/1999 | Farnworth et al. |
| 5,991,699 A | 11/1999 | Kulkarni et al. |
| 5,994,915 A | 11/1999 | Farnworth et al. |
| 6,000,830 A | 12/1999 | Asano et al. |
| 6,018,686 A | 1/2000 | Orso et al. |
| 6,049,624 A | 4/2000 | Wilson et al. |
| 6,055,463 A | 4/2000 | Cheong et al. |
| 6,067,507 A | 5/2000 | Beffa |
| 6,072,574 A | 6/2000 | Zeimantz |
| 6,075,216 A | 6/2000 | Nakamura et al. |
| 6,100,486 A | 8/2000 | Beffa |
| 6,122,563 A * | 9/2000 | Beffa .......... 700/121 |
| 6,130,442 A | 10/2000 | Di Zenzo et al. |
| 6,138,256 A | 10/2000 | Debenham |
| 6,147,316 A | 11/2000 | Beffa |
| 6,148,307 A | 11/2000 | Burdick et al. |
| 6,190,972 B1 | 2/2001 | Zheng et al. |
| 6,194,738 B1 | 2/2001 | Debenham et al. |
| 6,208,947 B1 | 3/2001 | Beffa |
| 6,219,810 B1 | 4/2001 | Debenham |
| 6,226,394 B1 | 5/2001 | Wilson et al. |
| 6,259,520 B1 | 7/2001 | Zeimantz |
| 6,265,232 B1 | 7/2001 | Simmons |
| 6,292,009 B1 | 9/2001 | Farnworth et al. |
| 6,307,171 B1 | 10/2001 | Beffa |
| 6,350,959 B1 | 2/2002 | Beffa |
| 6,363,295 B1 | 3/2002 | Akram et al. |
| 6,363,329 B1 | 3/2002 | Beffa |
| 6,365,421 B1 | 4/2002 | Debenham et al. |
| 6,365,860 B1 | 4/2002 | Beffa |
| 6,365,861 B1 | 4/2002 | Beffa |
| 6,373,011 B1 | 4/2002 | Beffa |
| 6,373,566 B1 | 4/2002 | Zeimantz |
| 6,400,840 B1 | 6/2002 | Wilson et al. |
| 6,424,168 B1 | 7/2002 | Farnworth et al. |
| 6,427,092 B1 | 7/2002 | Jones et al. |
| 6,437,271 B1 | 8/2002 | Beffa |
| 6,441,897 B1 | 8/2002 | Zeimantz |
| 6,504,123 B1 | 1/2003 | Beffa |
| 6,529,793 B1 * | 3/2003 | Beffa .......... 700/121 |
| 6,534,785 B1 | 3/2003 | Farnworth et al. |
| 6,553,276 B1 | 4/2003 | Akram et al. |
| 6,588,854 B1 | 7/2003 | Wilson et al. |
| 6,594,611 B1 | 7/2003 | Beffa |
| 6,613,590 B1 | 9/2003 | Simmons |
| 6,636,068 B1 | 10/2003 | Farnworth et al. |
| 6,654,114 B1 | 11/2003 | Zeimantz |
| 6,703,573 B1 | 3/2004 | Beffa |
| 6,788,993 B1 * | 9/2004 | Beffa .......... 700/121 |
| 6,895,538 B1 | 5/2005 | Benedix et al. |
| 6,944,567 B1 | 9/2005 | Beffa |

FOREIGN PATENT DOCUMENTS

| | | |
|---|---|---|
| JP | 5805728 | 3/1983 |
| JP | 58052814 A | 3/1983 |
| JP | 58060529 | 4/1983 |

| | | | | | | |
|---|---|---|---|---|---|---|
| JP | 61120433 | 6/1986 | | JP | 06013443 A | 1/1994 |
| JP | 02164017 A | 6/1990 | | JP | 06267809 A | 9/1994 |
| JP | 02246312 A | 10/1990 | | JP | 06349691 A | 12/1994 |
| JP | 04080949 A | 3/1992 | | JP | 07050233 | 2/1995 |
| JP | 04318911 A | 11/1992 | | JP | 07066091 A | 3/1995 |
| JP | 05013529 | 1/1993 | | JP | 08162380 A | 6/1996 |
| JP | 05-074909 | 3/1993 | | JP | 11008327 | 1/1999 |
| JP | 10104315 | 4/1993 | | SU | 1151333 | 4/1985 |
| JP | 05121573 A | 5/1993 | | | | |
| JP | 05315207 | 11/1993 | | * cited by examiner | | |

SORTING A GROUP OF INTEGRATED CIRCUIT DEVICES FOR THOSE DEVICES REQUIRING SPECIAL TESTING

CROSS-REFERENCE TO RELATED APPLICATIONS

This application is a continuation of application Ser. No. 10/791,193, filed Mar. 2, 2004, pending, which is a continuation of application Ser. No. 10/379,257, filed Mar. 3, 2003, now U.S. Pat. No. 6,788,993, issued Sep. 7, 2004, which is a continuation of application Ser. No. 09/607,201, filed Jun. 28, 2000, now U.S. Pat. No. 6,529,793, issued Mar. 4, 2003, which is a continuation of application Ser. No. 09/145,758, filed Sep. 2, 1998, now U.S. Pat. 6,122,563, issued Sep. 19, 2000, which is a continuation of application Ser. No. 08/801,565, filed Feb. 17, 1997, now U.S. Pat. No. 5,844,803, issued Dec. 1, 1998, which is related to: application having Ser. No. 08/591,238, entitled "METHOD AND APARATUS FOR STORAGE OF TEST RESULTS WITHIN AN INTEGRATED CIRCUIT," and filed Jan. 17, 1996 now abandoned; a co-pending application having Ser. No. 08/664,109, entitled "A STRUCTURE AND A METHOD FOR STORING INFORMATION IN A SEMICONDUCTOR DEVICE," and filed Jun. 13, 1996, now U.S. Pat. No. 5,895,962, issued Apr. 20, 1999; an application having Ser. No. 08/785,353, entitled "METHOD FOR SORTING INTEGRATED CIRCUIT DEVICES," and filed Jan. 17, 1997, now U.S. Pat. No. 5,927,512, issued Jul. 27, 1999; application having Ser. No. 08/822,731, entitled "METHOD FOR CONTINUOUS, NON LOT-BASED INTEGRATED CIRCUIT MANUFACTURING," and filed Mar. 24, 1997, now U.S. Pat. No. 5,856,923, issued Jan. 5, 1999; application having Ser. No. 08/806,442, entitled "METHOD IN AN INTEGRATED CIRCUIT (IC) MANUFACTURING PROCESS FOR IDENTIFYING AND REDIRECTING IC'S. MIS-PROCESSED DURING THEIR MANUFACTURE," and filed Feb. 26, 1997, now U.S. Pat. No. 5,915,231, issued Jun. 22, 1999; and application having Ser. No. 08/871,015, entitled "METHOD FOR USING DATA REGARDING MANUFACTURING PROCEDURES INTEGRATED CIRCUITS (IC'S) HAVE UNDERGONE, SUCH AS REPAIRS, TO SELECT PROCEDURES THE IC'S WILL UNDERGO, SUCH AS ADDITIONAL REPAIRS," and filed Jun. 6, 1997, now U.S. Pat. No. 5,907,492, issued May 25, 1999.

BACKGROUND OF THE INVENTION

1. Field of the Invention

The present invention relates in general to integrated circuit (IC) manufacturing and, more specifically, to methods in IC manufacturing processes for sorting IC devices using identification (ID) codes, such as fuse IDs, in the devices.

2. State of the Art

Integrated circuits (ICs) are small electronic circuits formed on the surface of a wafer of semiconductor material, such as silicon, in an IC manufacturing process referred to as "fabrication." Once fabricated, ICs are electronically probed to evaluate a variety of their electronic characteristics, cut from the wafer on which they were formed into discrete IC dice or "chips," and then assembled for customer use using various well-known IC packaging techniques, including lead frame packaging, Chip-On-Board (COB) packaging, and flip-chip packaging.

Before being shipped to customers, packaged ICs are generally tested to ensure they will function properly once shipped. Testing typically involves a variety of known test steps, such as pre-grade, burn-in, and final, which test ICs for defects and functionality and grade ICs for speed.

Figure 1:
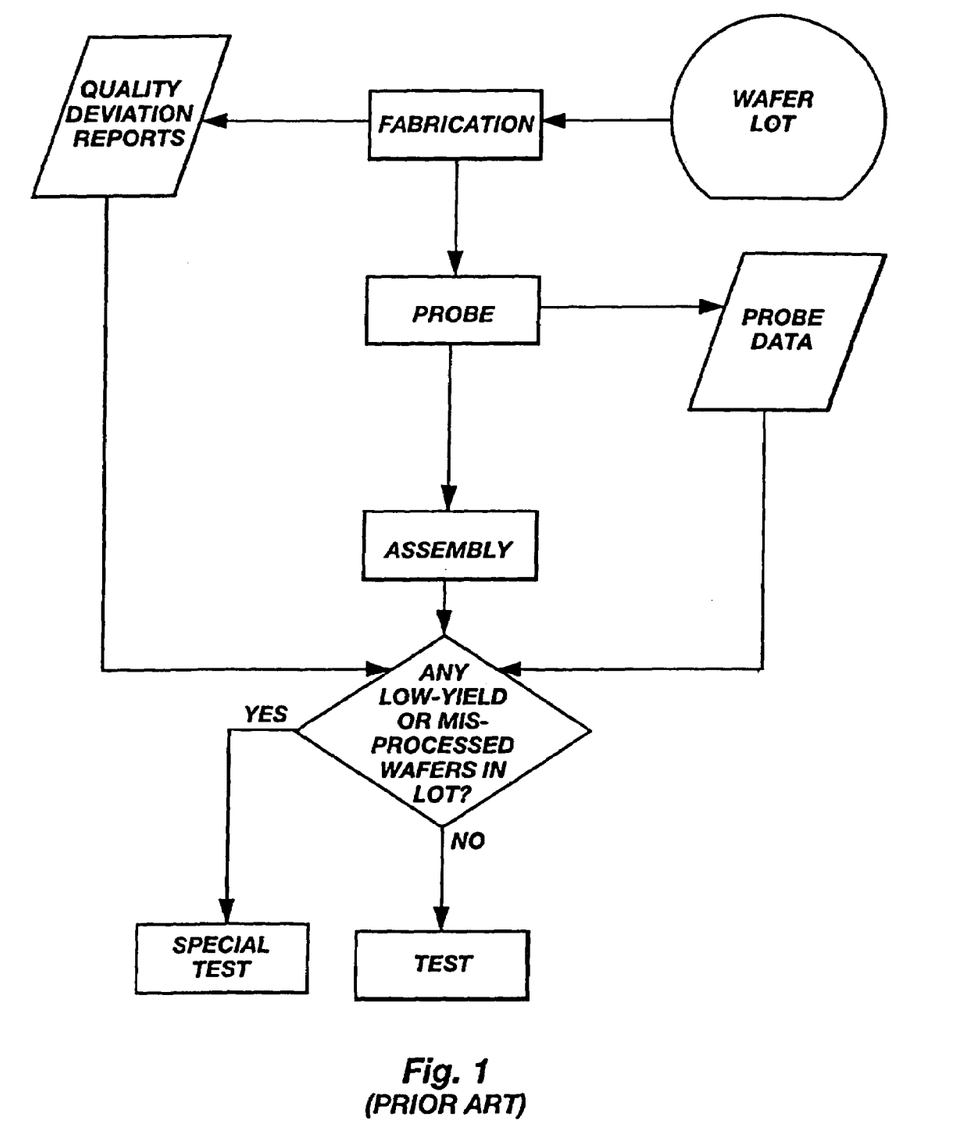
FIG. 1 is a flow diagram illustrating a conventional procedure in an integrated circuit (IC) manufacturing process for directing ICs to special testing, such as enhanced reliability testing.

As shown in FIG. 1, a variety of data are collected as ICs proceed through an IC manufacturing process. For example, fabrication deviation data reflecting quality deviations, such as fabrication process errors, are collected during fabrication and summarized in one or more reports commonly referred to as "Quality Deviation Reports" (QDRs). Similarly, data are collected during probe which record the various electronic characteristics of the ICs tested during probe.

When any of the wafers in a wafer lot are deemed to be unreliable because they are low yielding wafers, as indicated by the collected probe data, or because they are misprocessed wafers, as indicated by the QDRs, all the ICs from the wafers in the wafer lot typically undergo special testing, such as enhanced reliability testing, that is more extensive and strict than standard testing. Since a wafer lot typically consists of fifty or more wafers, many ICs that undergo the special testing do not require it because they come from wafers that are not deemed unreliable. Performing special testing on ICs that do not need it is inefficient because such testing is typically more time-consuming and uses more resources than standard testing. Therefore, there is a need in the art for a method of identifying those ICs in a wafer lot that require special testing and sorting the ICs in the wafer lot into those that require special testing and those that do not.

As described in U.S. Pat. Nos. 5,301,143, 5,294,812, and 5,103,166, some methods have been devised to electronically identify individual ICs. Such methods take place "off" the manufacturing line, and involve the use of electrically retrievable identification (ID) codes, such as so-called "fuse IDs," programmed into individual ICs to identify the ICs. The programming of a fuse ID typically involves selectively blowing an arrangement of fuses and anti-fuses in an IC so that when the fuses or anti-fuses are accessed, they output a selected ID code. Unfortunately, none of these methods addresses the problem of identifying and sorting ICs "on" a manufacturing line.

BRIEF SUMMARY OF THE INVENTION

An inventive method in an integrated circuit (IC) manufacturing process for sorting IC devices of the type having an identification (ID) code, such as a fuse ID, into those devices requiring a first testing process, such as enhanced reliability testing, and those devices requiring a second testing process, such as standard testing, includes storing data in association with the ID code of each of the devices that indicates each of the devices requires the first or the second testing process. The data may include fabrication deviation data, such as a Quality Deviation Report (QDR), probe data, standard test data, or special test data, such as enhanced reliability testing data. Also, the data may, for example, indicate the need for the first or second testing process by indicating that one or more semiconductor wafers or wafer lots have been misprocessed, or have relatively low yields at probe or during testing. Further, the data may be generated by IC devices other than those devices to be sorted, and may be generated at a point in the manufacturing process before or after the point at which sorting will take place.

The ID code of each of the IC devices to be sorted is automatically read. This may be accomplished, for example, by electrically retrieving a unique fuse ID programmed into each of the devices, or by optically reading a unique laser fuse ID programmed into each of the devices. Also, the data stored in association with the automatically read ID code of each of the IC devices is accessed, and the devices are then sorted in accordance with the accessed data into those devices requiring the first testing process and those devices requiring the second testing process.

The present invention thus provides a method that directs those ICs needing enhanced reliability testing to such testing without the need for all ICs from the same-wafer lot, including those from reliable wafers, to proceed through special testing.

In additional embodiments, the method described above is included in methods for manufacturing IC devices and Multi-Chip Modules (MCMs) from semiconductor wafers.

In a further embodiment, an inventive sorting method uses special test data generated by a first group of IC devices undergoing special testing to sort a second group of devices of the type having an identification (ID) code, such as a fuse ID, into those devices requiring the special testing and those requiring standard testing. Specifically, the method includes storing data in association with the ID code of some of the IC devices in the second group that indicates the devices require special testing. Special test data generated by the first group of devices is then stored in association with the ID codes of the previously mentioned devices in the second group, and the special test data indicates these devices in the second group that were previously indicated to require special testing instead require only standard testing. The ID codes of these devices in the second group are then automatically read, the data stored in association with the ID codes is accessed, and the second group of devices is sorted in accordance with the accessed data so the appropriate devices in the second group undergo standard testing.

DETAILED DESCRIPTION OF THE INVENTION

Figure 2:
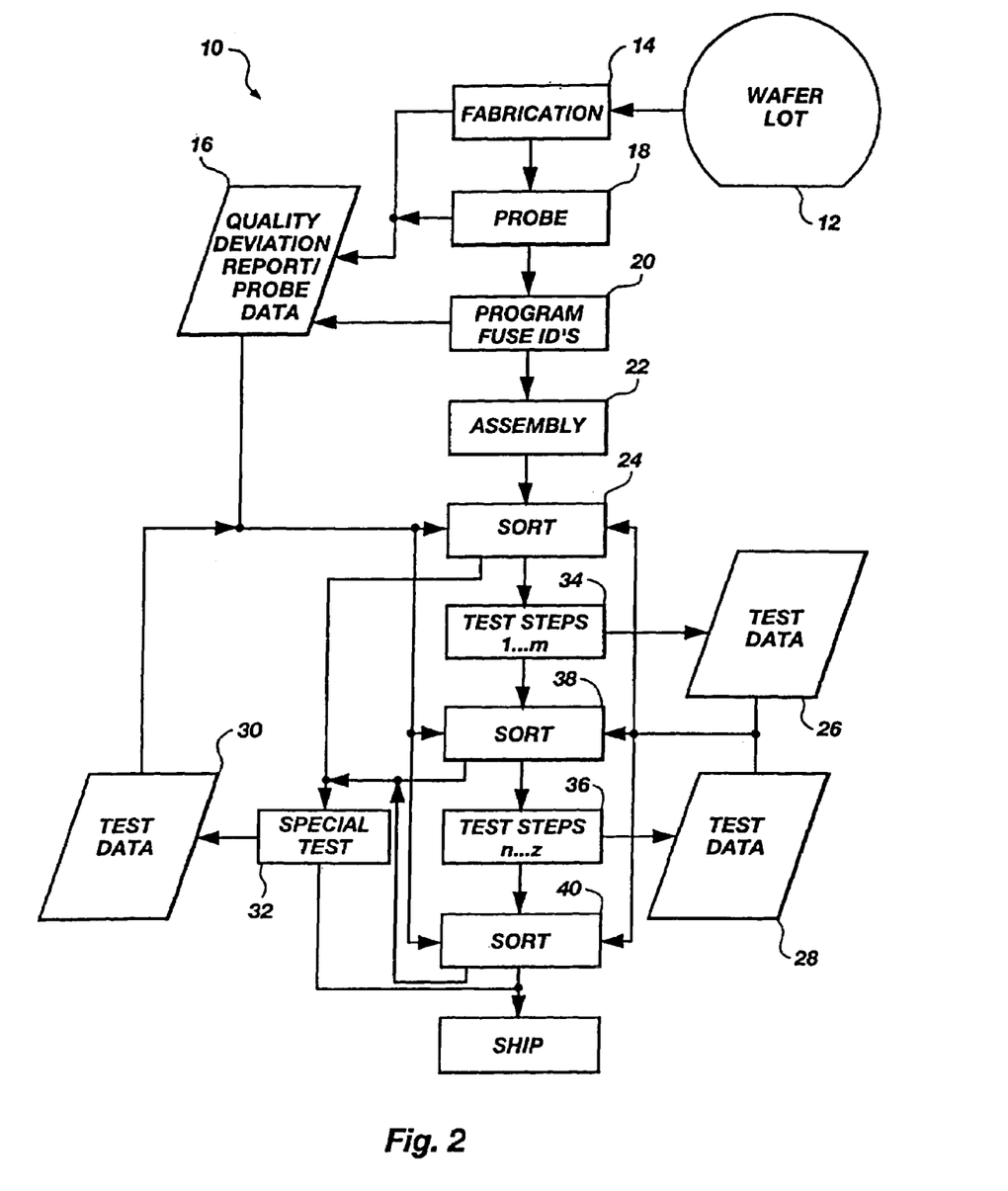
FIG. 2 is a flow diagram illustrating a procedure in an IC manufacturing process for directing ICs to special testing, such as enhanced reliability testing, in accordance with a preferred embodiment of the present invention.

As shown in FIG. 2, an inventive method 10 for manufacturing integrated circuits (ICs) from a group of semiconductor wafers in a wafer lot 12 includes the step 14 of fabricating the ICs on the wafers. Any fabrication process errors occurring during the fabrication step 14 are noted in a Quality Deviation Report (QDR) 16. It will be understood by those having skill in the field of this invention that the present invention is applicable to any IC devices, including Dynamic Random Access Memory (DRAM) ICs, Static Random Access Memory (SRAM) ICs, Synchronous DRAM (SDRAM) ICs, processor ICs, Single In-line Memory Modules (SIMMs), Dual In-line Memory Modules (DIMMs), and other Multi-Chip Modules (MCMs).

After fabrication, the ICs are electronically probed in a probe step 18 to evaluate a variety of their electronic characteristics, and data from the probe step 18 are noted and stored as probe data 16. The probe data 16 may include, for example, data indicating that one or more wafers are providing a relatively low yield of ICs that are functional at probe, or data indicating that an abnormal number of problems are associated with wafers from a particular wafer lot, or with ICs from the same position on a series of wafers, or with ICs processed by a particular piece of fabrication equipment.

Before, during, or after the probe step 18, ICs fabricated on the wafers are programmed in a program step 20 in the manner described above with a fuse identification (ID) unique to each IC. The fuse ID for each IC is then stored as data in association with the QDR/probe data 16 for that IC. The fuse ID may identify, for example, a wafer lot ID, the week the ICs were fabricated, a wafer ID, a die location on the wafer, and a fabrication facility ID. It will be understood, of course, that the present invention includes within its scope ICs having any ID code, including those having fuse IDs. It will also be understood that the ID code for each IC need not be unique, but instead may only specify the wafer the IC comes from, for example.

Once programmed, the ICs proceed through an assembly step 22 and then to a sort step 24. At this point in the manufacturing process, QDR/probe data 16 is available not only for those ICs presently at the sort step 24, but also for those ICs trailing the ICs presently at the sort step 24 which have completed the probe step 18. Therefore, sufficient QDR/probe data 16 may exist to determine that a particular wafer, for example, is unreliable as a result of low yields from the wafer at the probe step 18, or as a result of a processing error at the fabrication step 14. Similarly, sufficient QDR/probe data 16 may exist to determine that wafers from a particular wafer lot are unreliable, or that ICs from a particular location on a series of wafers are unreliable, or that ICs processed by a particular piece of fabrication equipment are unreliable.

As noted above, ICs that are deemed to be unreliable typically require some form of special testing, such as enhanced reliability testing, in which testing standards and methods are more strict than standard testing. Therefore, at the sort step 24, the fuse IDs of the ICs are automatically read so the QDR/probe data 16 (and test data 26, 28, and 30 as described below) stored in association with the fuse IDs may be accessed and used to sort the ICs into those ICs requiring special testing in a special test step 32, and those ICs requiring only standard testing in one or more test steps 34 and 36. It should be understood that although the fuse IDs are typically read electronically, they may also be read optically if the fuse ID consists of "blown" laser fuses that are optically accessible.

In general, the test data 26, 28, and 30 comprise data generated by ICs at one point in the IC manufacturing process which is used to sort ICs under test at a different point in the process. Thus, for example, test data 26 and 28 generated by ICs from a particular wafer may indicate that the wafer is unreliable because of low yields during the test steps 34 and 36. As a result, ICs from the same wafer that have yet to be tested may be diverted at the sort step 24 to the special test step 32.

Similarly, test data 26 and 28 generated by ICs from a particular wafer lot, or by ICs from a particular die location on a series of wafers, or by ICs that were processed by a particular piece of fabrication equipment at the fabrication step 14, may indicate that ICs respectively from the same wafer lot, or from the same die location, or that were processed by the same piece of fabrication equipment, are unreliable because of low yields or other problems at the test steps 34 and 36. As a result, ICs respectively from the same wafer lot, or from the same die location, or that were processed by the same piece of fabrication equipment, that have yet to be tested may be diverted at the sort step 24 to the special test step 32.

Likewise, test data 30 generated by ICs deemed unreliable and tested in the special test step 32 may indicate that similarly situated ICs that have yet to be tested are not, in fact, unreliable, and therefore need not be diverted to the special test step 32. The test data 26, 28, and 30 will be described in more detail below.

Thus, the present invention provides a method 10 that directs those ICs needing special testing to the special testing step 32 without the need for all ICs from the wafer lot 12, including those from reliable wafers, to proceed through the special testing step 32. In addition, because the method 10 takes advantage of test data 26 and 28 generated by already tested ICs to sort yet-to-be-tested ICs, the method 10 advantageously provides real-time feedback of data back up the manufacturing line. Further, because the method 10 takes advantage of QDR/probe data 16 generated by ICs trailing ICs presently at the sort step 24 to sort those ICs presently at the sort step 24, the method 10 advantageously provides real-time feedback of data down the manufacturing line.

Those ICs that proceed on to the standard test step 34 are tested in a variety of well-known ways so the test data 26 may be generated and stored for each IC in association with the fuse ID of the IC. It should be understood that the test step 34 may comprise many individual test procedures, or just one. It should also be understood that the test data 26 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 34, and test results for the ICs from the various stages of the test step 34.

The ICs tested in the test step 34 then proceed on to an intra-test sort step 38, where the fuse ICs of the tested ICs are again automatically read so the ICs can be sorted in accordance with the QDR/probe data 16, the test data 26, and the test data 28 and 30 of other previously tested ICs, into those ICs requiring special testing in the special test step 32, and those ICs eligible to continue with standard testing in the test step 36.

At the intra-test sort step 38, the QDR/probe data 16 and test data 26, 28, and 30 may identify those ICs in need of special testing in the same manner as described above with respect to the sort step 24. In addition, the test data 26 and 28 may indicate that ICs that were tested by a particular piece of test equipment at the test step 34 are unreliable because of low yields or other problems at the test steps 34 and 36. As a result, ICs that were processed by the same piece of test equipment may be diverted at the sort step 38 to the special test step 32.

Of course, it should be understood that the special test procedures conducted on ICs sorted out in the intra-test sort step 38 may differ from those conducted on ICs sorted out in the sort step 24. Also, it should be understood that the present invention includes within its scope those methods which include only a pre-test sort step, such as the sort step 24, or only an intra-test sort step, such as the sort step 38, or any combination thereof.

Those ICs that continue on to the standard test step 36 are also tested in a variety of well-known ways so the test data 28 may be generated and stored for each IC in association with the fuse ID of the IC. It should be understood that the test step 36 may comprise many individual test procedures, or just one. It should also be understood that the test data 28 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 36, and test results for the ICs from the various stages of the test step 36.

The ICs tested in the test step 36 then proceed on to a post-test sort step 40, where the fuse IDs of the tested ICs are yet again automatically read so the ICs can be sorted in accordance with the QDR/probe data 16, the test data 26 and 28, and the test data 30 of other previously tested ICs, into those ICs requiring special testing in the special test step 32, and those ICs eligible to be shipped (the disposition of non-shippable ICs is not shown).

At the post-test sort step 40, the QDR/probe data 16 and test data 26, 28, and 30 may identify those ICs in need of special testing in the same manner as described above with respect to the sort steps 24 and 38. In addition, the test data 28 may indicate that ICs that were tested by a particular piece of test equipment at the test step 36 are unreliable because of low yields or other problems at the test step 36. As a result, ICs that were processed by the same piece of test equipment may be diverted at the sort step 40 to the special test step 32.

Of course, it should be understood that the special test procedures conducted on ICs sorted out in the post-test sort step 40 may differ from those conducted on ICs sorted out in the sort step 24 and the intra-test sort step 38. Also, it should be understood that the present invention includes within its scope those methods which include only a pre-test sort step; such as the sort step 24, only an intra-test sort step, such as the sort step 38, or only a post-test sort step, such as the sort step 40, or any combination thereof.

Those ICs that proceed on to the special test step 32 are subjected to a variety of special tests, such as enhanced reliability tests, so the test data 30 may be generated and stored for each IC in association with the fuse ID of the IC. It should be understood that the special test step 32 may comprise many individual test procedures, or just one. It should also be understood that the test data 30 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 32, and test results for the ICs from the various stages of the test step 32. Of course, those ICs that pass the special test step 32 are generally allowed to ship.

The present invention thus provides an inventive method for identifying those ICs in a wafer lot that require special testing through the use of ID codes, such as fuse IDs, and for sorting the ICs in the wafer lot into those that require special testing and those that do not using the ID codes of the ICs. The invention also advantageously provides real-time feedback of data up and down the IC manufacturing line by using probe and test data generated by already probed or tested ICs to sort yet-to-be-tested ICs.

Although the present invention has been described with reference to a preferred embodiment, the invention is not limited to this embodiment. For example, while the various steps of the preferred embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. A method for determining the fabrication process for a plurality of inspected integrated circuit devices for grouping a first plurality of inspected integrated circuit devices to complete a first process and for grouping a second plurality of inspected integrated circuit devices to complete a second process different than the first process comprising:

storing data in association using an individual identification code of each of the plurality of inspected integrated circuit devices indicating each portion of the fabrication process the plurality of inspected integrated circuit devices have completed, the data including at least one portion of the fabrication process associated with the individual identification code of at least some of the plurality of inspected integrated circuit devices;

reading the individual identification code of each of the plurality of inspected integrated circuit devices;

accessing the data stored in association with the individual identification code of each of the plurality of inspected integrated circuit devices; and grouping the plurality of inspected integrated circuit devices in accordance with the accessed data into those of the plurality of inspected integrated circuit devices to complete the first process and those of the plurality of integrated circuit devices to complete the second process.

2. The method of claim 1, wherein storing data comprises storing data indicating one or more semiconductor wafers having inspected integrated circuit devices of the plurality of inspected integrated circuit devices have been subjected to an undesired process.

3. The method of claim 1, wherein storing data comprises storing data indicating one or more semiconductor wafers having inspected integrated circuit devices of the plurality of inspected integrated circuit devices have relatively low yields.

4. The method of claim 1, wherein storing data comprises storing data indicating one or more semiconductor wafer lots having inspected integrated circuit devices of the plurality of inspected integrated circuit devices have relatively low yields.

5. The method of claim 1, wherein the plurality of inspected integrated circuit devices come from a plurality of die locations on each of a plurality of semiconductor wafers, and wherein storing data comprises storing data indicating that inspected integrated circuit devices from identical die locations on each of a series of the plurality of semiconductor wafers have relatively low yields.

6. The method of claim 1, wherein the plurality of inspected integrated circuit devices come from a plurality of semiconductor wafers each fabricated on one of a plurality of pieces of fabrication equipment, and wherein storing data comprises storing data indicating that a series of the plurality of semiconductor wafers fabricated using a same piece of fabrication equipment has relatively low yields.

7. The method of claim 1, wherein the plurality of inspected integrated circuit devices come from a plurality of semiconductor wafers each tested on one of a plurality of pieces of test equipment, and wherein storing data comprises storing data indicating that a group of the plurality of semiconductor wafers tested using a same piece of test equipment has relatively low yields.

8. The method of claim 1, wherein the first process and the second process comprise respective standard and special testing processes, and wherein storing data comprises storing special test data indicating that inspected integrated circuit devices of the plurality of inspected integrated circuit devices previously indicated to require the special testing process instead require the standard testing process.

9. The method of claim 1, wherein storing data in association with the individual identification code of each of the plurality of inspected integrated circuit devices comprises storing data in association with the individual identification code of one or more inspected integrated circuit devices other than those inspected integrated circuit devices that are in the plurality of inspected integrated circuit devices to be grouped, the other inspected integrated circuit devices being at a different point in an integrated circuit manufacturing process than the inspected integrated circuit devices in the plurality of inspected integrated circuit devices to be grouped.

10. The method of claim 1, wherein reading the individual identification code of each of the plurality of inspected integrated circuit devices comprises electrically retrieving a unique fuse identification programmed into each of the plurality of inspected integrated circuit devices.

11. The method of claim 1, wherein reading the individual identification code of each of the plurality of inspected integrated circuit devices comprises optically reading a unique identification code provided on each of the plurality of inspected integrated circuit devices.

12. The method of claim 11, wherein optically reading the unique identification code provided on each of the plurality of inspected integrated circuit devices comprises optically reading a unique laser fuse identification programmed into each of the plurality of inspected integrated circuit devices.

13. The method of claim 1, wherein grouping the plurality of inspected integrated circuit devices in accordance with the accessed data into those inspected integrated circuit devices to undergo the first process and those inspected integrated circuit devices to undergo the second process comprises sorting the plurality of inspected integrated circuit devices before a standard testing process into those inspected integrated circuit devices requiring an enhanced reliability testing process and those inspected integrated circuit devices requiring the standard testing process.

14. The method of claim 1, wherein grouping the plurality of inspected integrated circuit devices in accordance with the accessed data into those inspected integrated circuit devices to undergo the first process and those inspected integrated circuit devices to undergo the second process comprises sorting the plurality of inspected integrated circuit devices during a standard testing process into those inspected integrated circuit devices requiring an enhanced reliability testing process and those inspected integrated circuit devices requiring the standard testing process.

15. The method of claim 1, wherein grouping the plurality of inspected integrated circuit devices in accordance with the accessed data into those inspected integrated circuit devices to undergo the first process and those inspected integrated circuit devices to undergo the second process comprises sorting the plurality of inspected integrated circuit devices after a standard testing process into those inspected integrated circuit devices requiring an enhanced reliability testing process and those inspected integrated circuit devices finished with testing.

16. The method of claim 1, wherein accessing the data comprises accessing one of fabrication equipment data, fabrication personnel data, fabrication set-up data, time and date data, yield data, and test data.

17. The method of claim 1, wherein each of the plurality of inspected integrated circuit devices has an associated lot identification, and wherein accessing the data comprises accessing data associated with the lot identification of an inspected integrated circuit device that is associated with each of the read identification codes.

18. A method of classifying a plurality of inspected integrated circuit devices for grouping a first plurality of inspected integrated circuit devices of a type having an identification code into a group of inspected integrated circuit devices to undergo a first process and for grouping a second plurality of inspected integrated circuit devices to undergo a second process comprising:
    storing data in association with an individual identification code of each of the plurality of inspected integrated circuit devices indicating each of the plurality of inspected integrated circuit devices undergoes one of the first process and the second process, the data including one or more of fabrication deviation data, probe data, standard test data, special test data, and enhanced reliability testing data associated with the individual identification code of at least some of the plurality of inspected integrated circuit devices;
    reading the individual identification code of each of the plurality of inspected integrated circuit devices;
    accessing the data stored in association with the individual identification code of each of the plurality of inspected integrated circuit devices; and
    grouping the plurality of inspected integrated circuit devices in accordance with the accessed data into those of the plurality of inspected integrated circuit devices to undergo the first process and those of the plurality of integrated circuit devices to undergo the second process.

\* \* \* \* \*

UNITED STATES PATENT AND TRADEMARK OFFICE
CERTIFICATE OF CORRECTION

PATENT NO. : 7,117,063 B2 Page 1 of 1
APPLICATION NO. : 11/240178
DATED : October 3, 2006
INVENTOR(S) : Beffa It is certified that error appears in the above-identified patent and that said Letters Patent is hereby corrected as shown below:

On the Title page, item (73), in "Assignee", in column 1, line 1, delete "Micro" and insert -- Micron --, therefor.

Signed and Sealed this

Twenty-fifth Day of March, 2008

JON W. DUDAS
*Director of the United States Patent and Trademark Office*